(12) United States Patent
Tanizawa

(10) Patent No.: US 6,598,484 B2
(45) Date of Patent: Jul. 29, 2003

(54) PHYSICAL QUANTITY DETECTION DEVICE

(75) Inventor: Yukihiko Tanizawa, Kariya (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 09/964,396

(22) Filed: Sep. 28, 2001

(65) Prior Publication Data

US 2002/0053916 A1 May 9, 2002

(30) Foreign Application Priority Data

Oct. 6, 2000 (JP) .................................. 2000-308039

(51) Int. Cl.[7] .................................................. G01L 9/16
(52) U.S. Cl. ............................................................ 73/754
(58) Field of Search .............................. 73/754, 756, 720, 73/727, 704, 702

(56) References Cited

U.S. PATENT DOCUMENTS

| | | | |
|---|---|---|---|
| 5,289,721 A | | 3/1994 | Tanizawa et al. |
| 5,468,962 A | | 11/1995 | Ohishi et al. |
| 6,422,088 B1 | * | 7/2002 | Oba et al. ............. 73/754 |

FOREIGN PATENT DOCUMENTS

| | | |
|---|---|---|
| JP | A-7-140075 | 6/1995 |
| JP | A-8-166304 | 6/1996 |
| JP | B2-2976487 | 9/1999 |

OTHER PUBLICATIONS

Gray and Meyer, *Analysis and Design of Analog Integrated Circuit ( Second Edision)*, pp. 254–257, 1990. (partial English translation attached).

* cited by examiner

Primary Examiner—Hezron Williams
Assistant Examiner—Alandra Ellington
(74) Attorney, Agent, or Firm—Posz & Bethards, PLC

(57) ABSTRACT

Respective first ends of first and second strain gates are connected to a first voltage potential. First and second constant currents from first and second current sources flow through the first and second strain gages, respectively. The respective first ends of the first and second current sources are connected to second ends of the first and second strain gages, respectively. A voltage difference signal between the second ends of the first and second strain gages indicates the detected physical quantity. The first and second constant currents are adjusted to reduce the offset voltage in the voltage difference signal when no strain, that is, no physical quantity is measured. The first and second current sources may have substantially the same temperature coefficients in said first and second constant currents, respectively.

19 Claims, 12 Drawing Sheets

Vout = Voff when no pressure is detected

Vout = Voff when no pressure is detected

PHYSICAL QUANTITY DETECTION DEVICE

BACKGROUND OF THE INVENTION

1. Field of the Invention

This invention relates to a physical quantity detection device for detecting a physical quantity through resistance variation.

2. Description of the Prior Art

A detection circuit for a semiconductor pressure sensor using the piezoresistance effect is known. FIGS. 6A and 6B show examples of such a detection circuit. Japanese patent publication No. 2976487 discloses this detection circuit for a strain gage with temperature characteristic compensation.

The piezoresistance effect in diffusion resistors decreases with increase in the temperature, which decreases the sensitivity. On the other hand, the resistance increases. Particularly, the increase in the resistance depends on a density of impurity in the diffused resistors forming the strain gages. When the strain gages are driven with a constant current, the voltage applied to the strain gages increases with increase in the temperature. This provides compensation of decrease in the sensitivity in the sensor in accordance with the density of the impurity in the diffused resistors. This is the reason for using the circuits shown in FIGS. 6A and 6B.

In FIGS. 6A and 6B, when the diffused resistors Ra to Rd sense no strain (stress), that is, if no physical quantity is applied to this sensor, it is desirable that Ra=Rb=Rc=Rd. In this condition the output of the sensor ΔVout=0.

However, dispersion in manufacturing results in Ra≠Rb≠Rc≠Rd, so that ΔVout≠0. This is referred to as an offset voltage Voff.

In the condition that the offset voltage is developed, that is, ΔVout=Voff≠0, if a constant current is applied to the strain gage, the larger offset voltage, the more the temperature characteristic in the offset voltage (hereinafter referred to as offset temperature characteristic) increases. Therefore, to compensate the offset temperature characteristic, it is necessary to add a separate compensation circuit.

Moreover, it is necessary to obtain data of the offset temperature characteristic with large variation of temperature during the manufacturing process and to adjust the offset temperature characteristic on the basis of the data.

Japanese patent publication No. 2976487 discloses an example of the prior art offset temperature compensation circuit as shown in FIG. 7.

In this circuit, the resistors R9, R10, R11 correspond to the offset temperature compensation circuit.

Prior to explanation of the offset temperature compensation circuit, operation of the whole circuit will be described.

The operational amplifier OP1 operates to equalize the voltage drop in the resistor R3 to that in the resistor R5. Therefore, if a resistor having a temperature coefficient of resistance (TCR) of almost zero is used as the resistor R5, a current Io flowing through the bridge circuit including gage resistors Ra to Rd is substantially constant, though the temperature varies.

Here, using diffused resistors including boron as the gage resistors Ra to Rd and making the density of the p type impurity in the gage resistors Ra to Rd about $10^{20}$ cm$^{-3}$ provides temperature compensation to sensitivity. This corresponds to the sensitivity-temperature compensation circuit.

The operational amplifier OP2 and the operational amplifier OP3 connected to a resistor R6 are used as voltage follower circuits to convert the bridge output voltage into a current with the resistor R6. The current is supplied to an operational amplifier OP4 through transistors Tr1 and Tr2 having Darlington connection. The operational amplifier OP4 amplifies the current. The resistor R8 connected to the input of the operational amplifier OP4 is used for zero point adjustment.

The offset voltage of the bridge circuit can be made zero by laser-trimming the resistor R1 or R2 which is formed with CrSi thin film resistor having an almost zero TCR. However, because its TCR is largely different from those of the gage resistors Ra to Rd (about 1600 ppm/° C.), the offset voltage varies with the temperature.

In this circuit, operation of the resistors R9, R10, R11 for offset temperature compensation will be described. Here, these resistors have a relation R9=R10<<R11. This condition makes the current flowing through the resistor R11 constant though the temperature varies.

At first, because the bridge circuit is driven with a constant current, the applied voltage thereto varies at a TCR which is the same as that of the gage resistors Ra to Rd. Accordingly, the voltage potential V6 decreases with increase in temperature. On the contrary, the voltage difference between the voltage potentials V6 and Vd increases.

Therefore, laser-trimming the resistor R9 to have the voltage Vf relatively approached the ground potential decreases the current flowing through the resistor R11 with increase in temperature. On the other hand, laser-trimming the resistor R10 to have the potential Vf approached the potential Vd increases the current flowing through the resistor R11 with increases in temperature. That is, trimming the resistor R9 or R10 provides a temperature characteristic to the current flowing through the resistor R11. This temperature characteristic compensates the temperature characteristic in the bridge output. The offset temperature characteristic can be compensated in this way.

However, this operation requires measurement at the room temperature and at a high temperature for every circuit and laser trimming to obtain a target resistance which is calculated for the desired potential of Vf.

SUMMARY OF THE INVENTION

The aim of the present invention is to provide a superior physical quantity detection circuit.

According to the present invention, a first aspect of the present invention provides a physical quantity detection device comprising: a first sensing resistor having a first resistance varying in accordance with a first physical quantity relating a detection physical quantity; a second sensing resistor having a second resistance varying in accordance with a second physical quantity relating said detection physical quantity, first ends of said first and second sensing resistors being connected to a first voltage potential; a first current source for flowing a first constant current through said first sensing resistor, a first end of said first current source being connected to a second end of said first sensing resistor; a second current source for flowing a second constant current through said second sensing resistor, a first end of said second current source being connected to a second end of said second sensing resistor, second ends of said first and second current sources being connected to a second potential which is different from said first voltage potential; and outputting means for outputting a voltage difference signal indicative of said detection physical quantity between the second ends of said first and second sensing resistors.

According to the present invention, a fourth aspect of the present invention provides a physical quantity detection device based on the third aspect, wherein second ends of said first and second resistors are connected to each other at a junction point, said physical quantity detection device further comprising a third resistor connected to said junction point, wherein said first and second resistors are connected to said second potential through said third resistor, and a voltage potential of said junction point of said first and second resistors is supplied to an input of said operational amplifier.

According to the present invention, a fifth aspect of the present invention provides a physical quantity detection device based on the third aspect, wherein second ends of said first and second resistors are connected to each other at a junction point, and a voltage potential of said junction point is supplied to an input of said operational amplifier.

According to the present invention, a fifth aspect of the present invention provides a physical quantity detection device based on the third aspect, wherein one ends of said first and second resistors are connected to each other at a junction point, and a voltage potential of said junction point is supplied to an input of said operational amplifier.

According to the present invention, a sixth aspect of the present invention provides a physical quantity detection device based on the third aspect, wherein either of said first or second resistors is trimmed.

According to the present invention, a seventh aspect of the present invention provides a physical quantity detection device based on the first aspect, wherein said first current source includes a first control element connected to said first sensing resistor in series, and a first resistor connected to said first control element in series, and a first amplifier for generating a first control voltage supplied to said first control element on the basis of a first reference voltage, and said second current source includes a second control element connected to said second sensing resistor in series, a second resistor connected to said second control element in series, and a second amplifier for generating a second control voltage supplied to said second control element on the basis of a second reference voltage.

According to the present invention, an eighth aspect of the present invention provides a physical quantity detection device based on the seventh aspect, wherein a voltage potential at a first junction point between said first control element and said first resistor is supplied to an input of said first operational amplifier and a voltage potential at a second junction point between said second control element and said second resistor is supplied to an input of said second operational amplifier.

According to the present invention, a ninth aspect of the present invention provides a physical quantity detection device comprising: a first circuit including a first sensing resistor and a first constant current source connected to said first sensing resistor in series through a first junction point, said first sensing resistor having a first resistance varying in accordance with a first physical quantity relating to a detection physical quantity, said first constant current source flowing a first constant current through said first sensing resistor; a second circuit including a second sensing resistor and a second constant current source connected to said second sensing resistor in series through a second junction point, said second sensing resistor having a second resistance varying in accordance with a second physical quantity relating said detection physical quantity, said second constant current source flowing a second constant current through said second sensing resistor, first ends of said first and second circuits being connected to a first potential, second ends of said first and second circuits being connected to a second potential which is different from said first potential; and outputting means for outputting a voltage difference signal indicative of said detection physical quantity between said first and second junction points.

According to the present invention, a tenth aspect of the present invention provides a physical quantity detection device based on the ninth aspect, wherein said first and second current sources have substantially the same temperature coefficients in said first and second constant currents, respectively.

According to the present invention, an eleventh aspect of the present invention provides a physical quantity detection device based on the ninth aspect further comprises an operational amplifier for generating a control voltage on the basis of a reference voltage, said operational amplifier being shared by said first and second current sources, wherein said first current source further includes a first control element and a first resistor for flowing said first constant current on the basis of said control voltage, and said second current source further includes a second control element and a second resistor for flowing said second constant current on the basis of said control voltage.

According to the present invention, a twelfth aspect of the present invention provides a physical quantity detection device based on the eleventh aspect wherein second ends of said first and second resistors are connected to each other at a junction point, said physical quantity detection device further comprising a third resistor connected to said junction point, wherein said first and second resistors are connected to said second potential through said third resistor, and a voltage potential of said junction point of said first and second resistors is supplied to an input of said operational amplifier.

According to the present invention, a thirteenth aspect of the present invention provides a physical quantity detection device based on the eleventh aspect, wherein second ends of said first and second resistors are connected to each other at a junction point, and a voltage potential of said junction point is supplied to an input of said operational amplifier.

According to the present invention, a fourteenth aspect of the present invention provides a physical quantity detection device based on the eleventh aspect, wherein either of said first or second resistors is trimmed.

According to the present invention, a fifteenth aspect of the present invention provides a physical quantity detection device based on the ninth aspect, wherein said first current source includes a first control element connected to said first sensing resistor in series, and a first resistor connected to said first control element in series, and a first amplifier for generating a first control voltage supplied to said first control element on the basis of a first reference voltage, and said second current source includes a second control element connected to said second sensing resistor in series, a second resistor connected to said second control element in series, and a second amplifier for generating a second control voltage supplied to said second control element on the basis of a second reference voltage.

According to the present invention, a sixteenth aspect of the present invention provides a physical quantity detection device based on the fifteenth aspect, wherein a voltage potential at a first junction point between said first control element and said first resistor is supplied to an input of said first operational amplifier and a voltage potential at a second junction point between said second control element and said second resistor is supplied to an input of said second operational amplifier.

According to the present invention, a seventeenth aspect of the present invention provides a method of adjusting an offset voltage in a physical quantity detection device comprising: a first sensing resistor having a first resistance varying in accordance with a first physical quantity relating a detection physical quantity; a second sensing resistor having a second resistance varying in accordance with a second physical quantity relating said detection physical quantity, first ends of said first and second sensing resistors being connected to a first voltage potential; a first current source for flowing a first constant current through said first sensing resistor, a first end of said first current source being connected to a second end of said first sensing resistor; a second current source for flowing a second constant current through said second sensing resistor, a first end of said second current source being connected to a second end of said second sensing resistor, the second ends of said first and second current sources being connected to a second potential which is different from said first voltage potential; and outputting means for outputting a voltage difference signal indicative of said detection physical quantity between the second ends of said first and second sensing resistors with said offset voltage, said method comprising the steps of: measuring said offset voltage at a temperature within a usable temperature range of said physical quantity detection device; and adjusting said first and second constant currents on the basis said measured offset voltage.

According to the present invention, an eighteenth aspect of the present invention provides a method of adjusting an offset voltage in a physical quantity detection device comprising: a first sensing resistor having a first resistance varying in accordance with a first physical quantity relating a detection physical quantity; a second sensing resistor having a second resistance varying in accordance with a second physical quantity relating said detection physical quantity, first ends of said first and second sensing resistors being connected to a first voltage potential; a first current source for flowing a first constant current through said first sensing resistor, a first end of said first current source being connected to a second end of said first sensing resistor, said first current source includes a first control element and a first resistor for flowing said first constant current on the basis of a control voltage; a second current source for flowing a second constant current through said second sensing resistor, a first end of said second current source being connected to a second end of said second sensing resistor, said second current source includes a second control element and a second resistor for flowing said second constant current on the basis of said control voltage; an operational amplifier shared by said first and second constant current sources for generating said control voltage on the basis of a reference voltage, wherein a difference voltage between a first junction point between said first sensing resistor and said first current source and a second junction point between said second sensing resistor and said second current source has an offset voltage, said method comprising the steps of: measuring said offset voltage; and trimming either of said first or second resistors to adjust said offset voltage.

According to the present invention, a nineteenth aspect of the present invention provides a method of adjusting an offset voltage in a physical quantity detection device comprising: a first sensing resistor having a first resistance varying in accordance with a first physical quantity relating a detection physical quantity; a second sensing resistor having a second resistance varying in accordance with a second physical quantity relating said detection physical quantity, first ends of said first and second sensing resistors being connected to a first voltage potential; a first current source for flowing a first constant current through said first sensing resistor, a first end of said first current source being connected to a second end of said first sensing resistor, said first current source including a first control element and a first resistor for flowing said first constant current on the basis of a first control voltage, and a first operational amplifier for generating said first control voltage on the basis of a first reference voltage; a second current source for flowing a second constant current through said second sensing resistor, a first end of said second current source being connected to a second end of said second sensing resistor, said second current source including a second control element and a second resistor for flowing said second constant current on the basis of a second control voltage, and a second operational amplifier for generating said second control voltage on the basis of a second reference voltage, wherein a difference voltage between a first junction point between said first sensing resistor and said first current source and a second junction point between said second sensing resistor and said second current source indicates said detection physical quantity wherein said difference voltage includes an offset voltage, and the difference voltage is equal to the offset voltage when the detection physical quantity is not detected by the physical quantity detection device, said method comprising the steps of: measuring said offset voltage; and controlling said first and second reference voltages to adjust said offset voltage on the basis of the measuring.

BRIEF DESCRIPTION OF THE DRAWINGS

The object and features of the present invention will become more readily apparent from the following detailed description taken in conjunction with the accompanying drawings.

The same or corresponding elements or parts are designated with like references throughout the drawings.

DETAILED DESCRIPTION OF THE INVENTION

[First Embodiment]

Figure 1A:
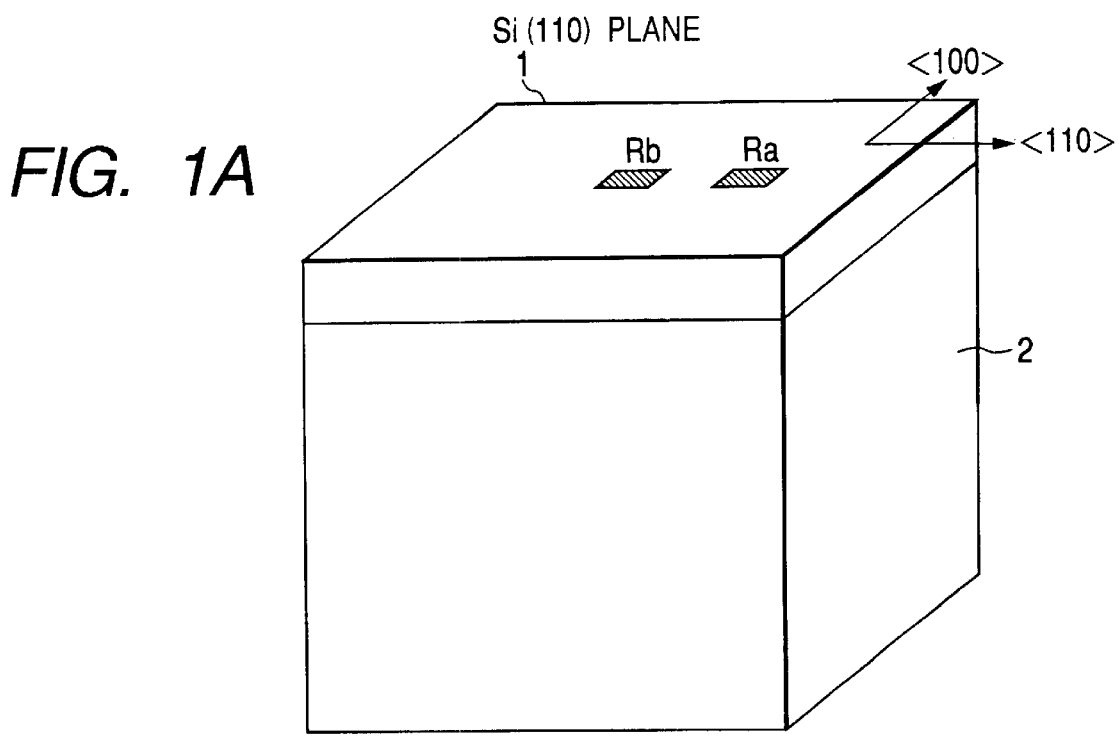
FIG. 1A is a perspective view of a semiconductor pressure sensor according to the present invention.
Figure 1B:
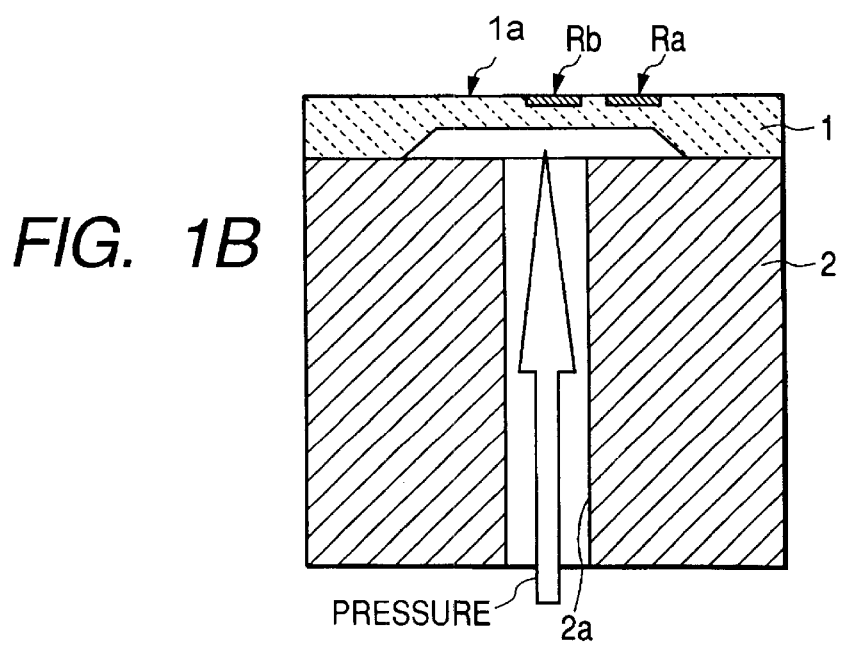
FIG. 1B is a sectional side elevation view of the semiconductor pressure sensor shown in FIG. 1A.
Figure 2:
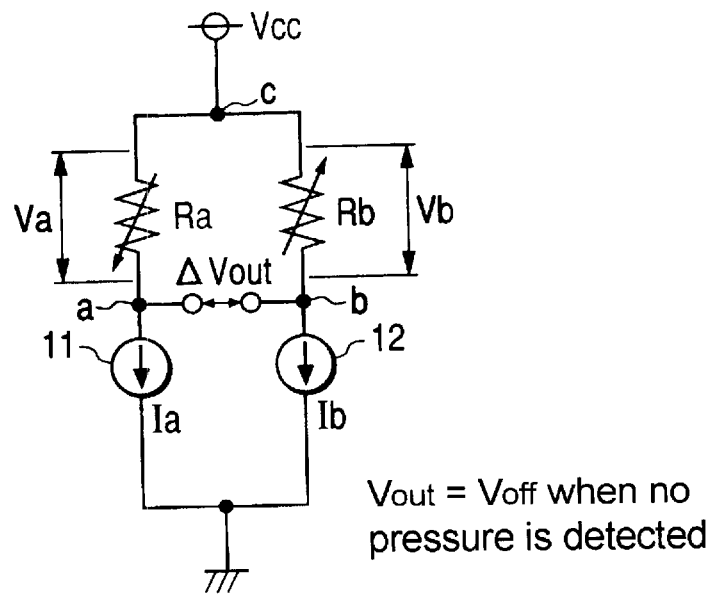
FIG. 2 is an equivalent circuit diagram of a physical quantity detection circuit according to the present invention.

FIG. 1A shows a perspective view of a semiconductor pressure sensor according to the present invention, and FIG. 1B shows its sectional side elevation view. FIG. 2 shows an equivalent circuit diagram of a physical quantity detection circuit according to a first embodiment.

In structure, the silicon substrate 1 is formed to have a (110)-plane and has a diaphragm 1a provided by thinning by etching with a KOH aqueous solution at the middle portion of the silicon substrate 1. In the diaphragm 1a, strain gages (sensing resistors) Ra and Rb are formed with diffused resistors in the top surface of the silicon substrate 1. The longitudinal direction of the strain gages Ra and Rb, that is, the direction in which currents mainly flow, agrees with the direction <110>. This silicon substrate 1 is adhered to a base 2 having a pressure introducing hole 2a.

In operation, when a pressure such as an air pressure (positive pressure) is applied to the diaphragm 1a through the pressure introducing hole 2a, the diaphragm 1a bends upwardly (in drawing). This develops a tensile stress at the center of the top surface of the diaphragm 1a where the strain gage Rb is formed and a compression stress at the edge of the diaphragm 1a where the strain gage Ra is formed. This increases the resistance of the strain gage Rb and decreases the resistance of the strain gage Ra by the piezoresistance effect.

The base 2 is made of a material having a linear expansion coefficient which is near that of silicon to release thermal stresses from other members.

Referring now to FIG. 2, the physical quantity detection device includes strain gages Ra and Rb and first and second constant current sources 11 and 12, wherein one end of the strain gage Ra is connected to a junction point "c" to which a supply voltage (common potential) Vcc is supplied. The other end is connected to a junction point "a" which is connected to the constant current source (first constant current source) 11 for flowing a constant current Ia. Moreover, one end of the strain gage Rb is connected to the junction point "c", and the other end is connected to a junction point "b" which is connected to a constant current source 12 for flowing a constant current Ib. The constant current Ia from the constant current source 11 and the constant current Ib from the constant current source 12 are generated so as to have the same temperature coefficient or to keep the intensity of currents though the temperature of the pressure sensor varies.

This circuit structure provides the sensor output ΔVout as the difference in potential between the junction points "a" and "b".

Here, in the condition that there is no pressure applied to the diaphragm 1a, ideally, the following equation is given as to the resistors Ra and Rb.

$$Ra=Rb=Rx \quad (1)$$

where Rx is a resistance when the resistors Ra and Rb are ideally formed.

The sensor output ΔVout is given by:

$$\Delta Vout=RbIb-RaIa \quad (2)$$

Moreover, if the following equation is true as to the constant currents Ia and Rb, the sensor output ΔVout=0.

$$Ia=Ib\equiv I \quad (3)$$

However, generally, the strain gages Ra and Rb formed with the diffused resistors cannot be ideally formed due to dispersion in the line width or the like in the photolithograph process and thus, have dispersion in the resultant resistances. These dispersions in the strain gages Ra and Rb are defined by Ra=R+ΔRa and Rb=R+ΔRb.

According to Eq. 2, the offset voltage Voff due to dispersions in the strain gages Ra and Rb is obtained as follows:

$$Voff \equiv \Delta Vout = R(Ib-Ia) + \Delta RbIb - \Delta RaIa \quad (4)$$

The temperature dependency of ΔVoff is obtained by partial differentiating Eq. 4 with temperature T as follows:

$$\partial(Voff)/\partial T = Voff \cdot \{TCR+(\partial I/\partial T)/I\} \quad (5)$$

where TCR is a resistance temperature coefficient of the gage resistors Ra and Rb and the term $(\partial I/\partial T)/I$ is a temperature coefficient of the current. They are defined as follows:

$$TCR \equiv (\partial R/\partial T)/R \quad (6)$$
$$= (\partial \Delta Ra/\partial T)/\Delta Ra$$
$$= (\partial \Delta Rb/\partial T)/\Delta Rb$$

$$(\partial I/\partial T)/I \equiv (\partial Ia/\partial T)/Ia \quad (7)$$
$$= (\partial Ib/\partial T)Ib$$

Here, it is assumed that ΔRa and ΔRb have the same TCR as R. Accordingly, if the temperature coefficients of the constant currents Ia and Ib are equal to each other or zero, according to Eqs. 5 and 7, the condition for eliminating the temperature dependency of the offset voltage is that Voff=0, which establishes ∂(Voff)/∂T=0.

This means that only adjusting the constant current Ia or Ib at a temperature within the usable temperature range of the pressure sensor (for example, −30 to 120° C.), for example, at a room temperature so as to make the offset voltage Voff=0, provides temperature compensation at the zero output voltage.

Therefore, in the circuit structure shown in FIG. 2, in the condition that temperature coefficients of the constant currents Ia and Ib are equal to each other or zero, adjusting the constant current Ia in the constant current source 11 and the constant current Ib in the constant current source 12 so as to make the offset voltage Voff zero provides the offset temperature characteristic compensation.

This eliminates the necessity of measurement of data of the offset temperature characteristic with the temperature being varied for every detection circuit and the necessity of compensation of the offset temperature characteristic according to the measured data, which were conventionally required.

Moreover, other operations according to the circuit structures shown in the equivalent circuit diagrams in FIG. 2 and FIG. 11, mentioned later, according to the present invention will described with reference to the prior art shown in FIG. 6.

Figure 6A:
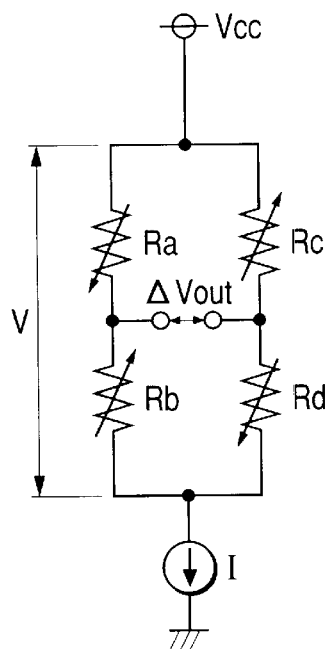
FIGS. 6A and 6B are equivalent circuit diagrams of prior art detection circuits.
Figure 6B:
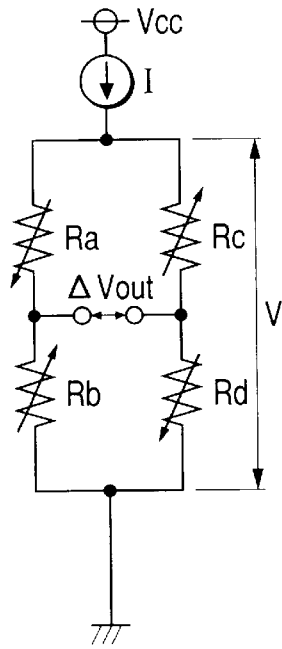
Figure 7:
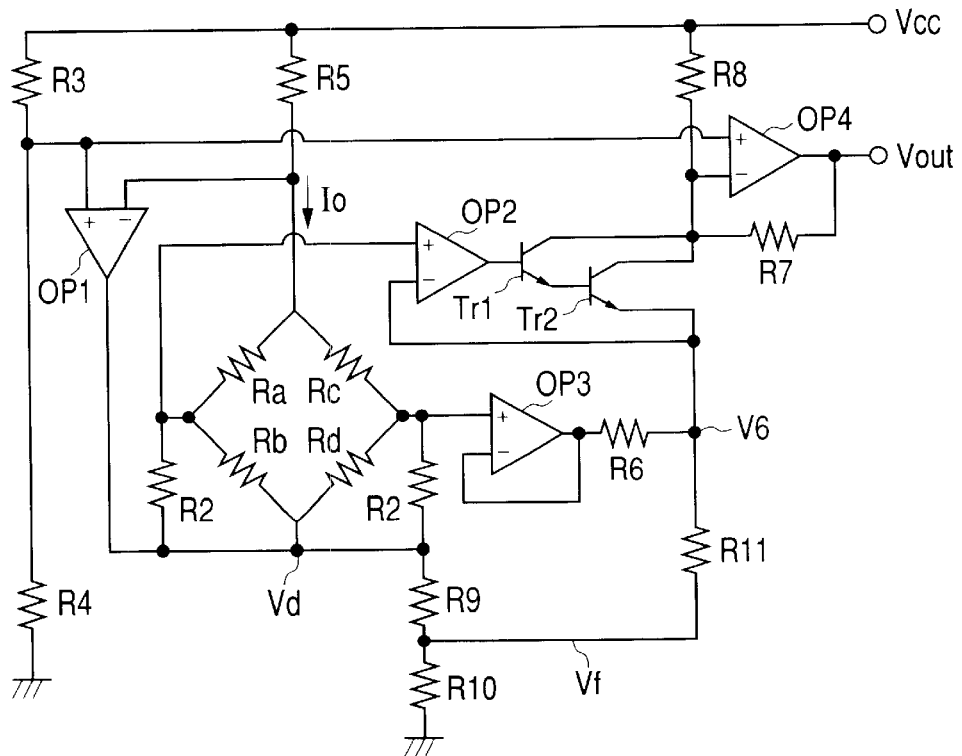
FIG. 7 is a schematic circuit diagram of a prior art detection circuit with an offset temperature compensation circuit.

In FIG. 6, if it is assumed that Ra=Rd=R−ΔR and Rb=Rc=R+ΔR when the pressure is applied to the diaphragm 1a, and the voltage applied to the bridge when a current I flows therethrough is V, the output is given by:

$$\Delta Vout = (\Delta R/R) \cdot V \quad (8)$$

Figure 11:
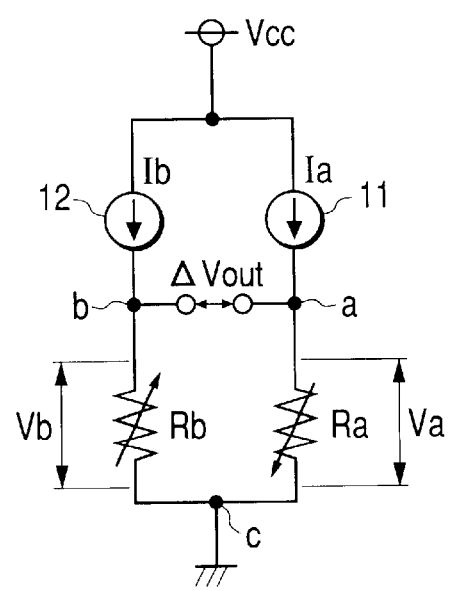
FIG. 11 is an equivalent circuit diagram of a modification of the physical quantity detection circuit shown in FIG. 2.
Figure 12:
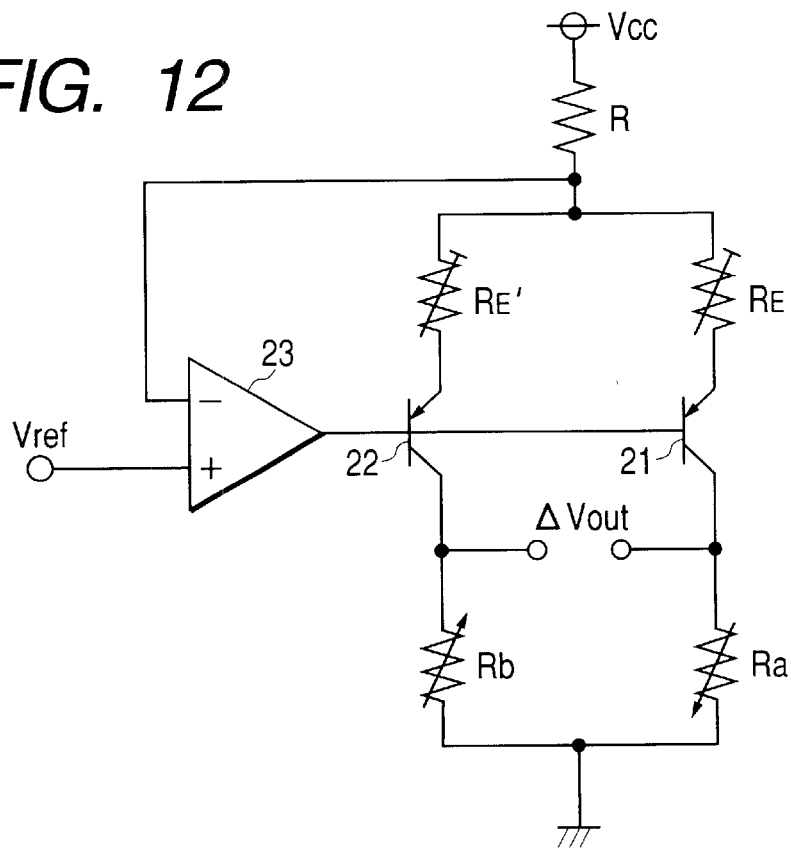
FIGS. 12 to 17 are schematic circuit diagrams of actual physical quantity detection circuits according to the modification physical quantity detection circuit shown in FIG. 11.
Figure 13:
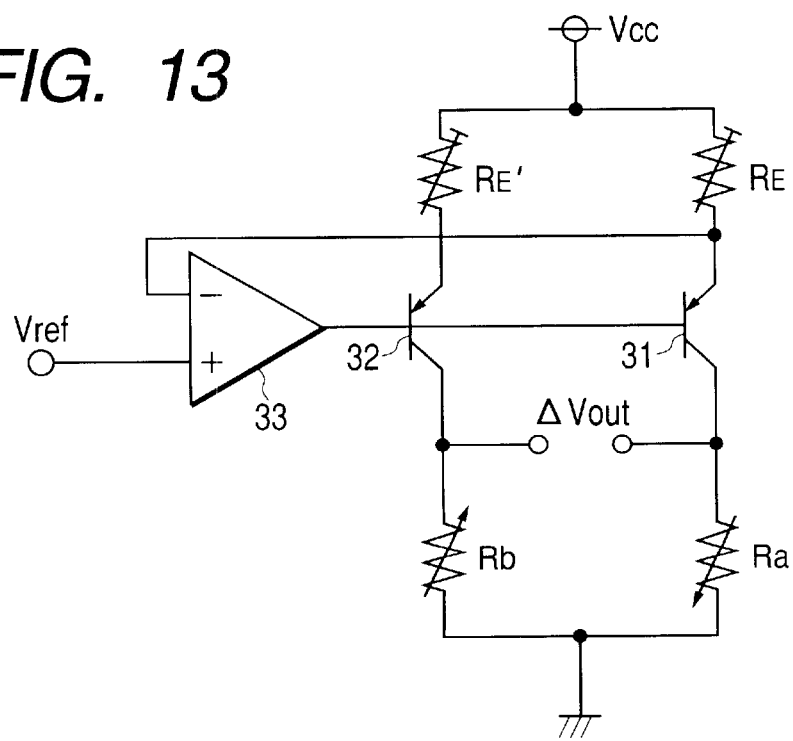
Figure 14:
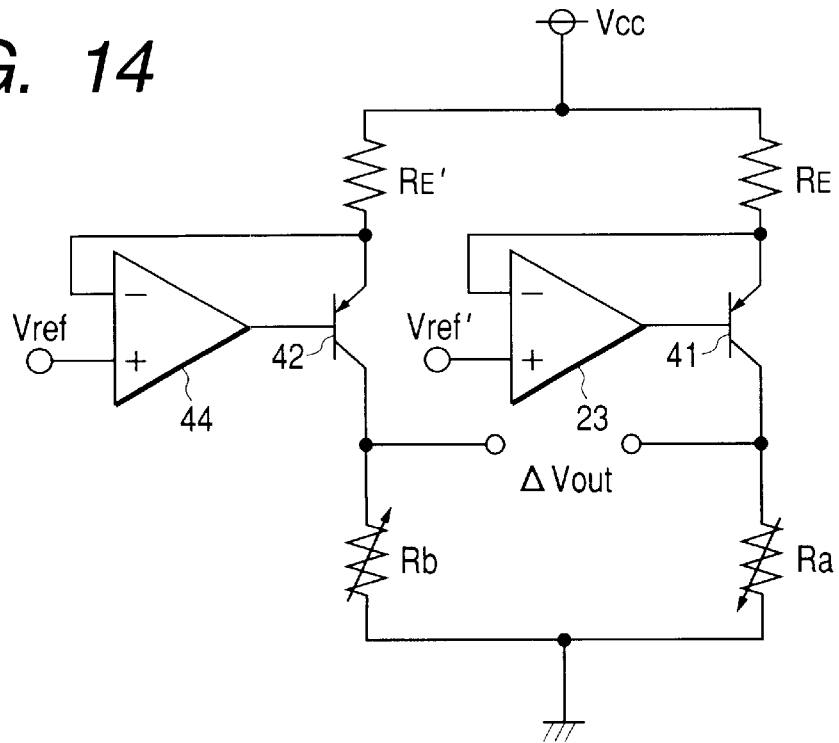

On the other hand, in the circuit structures shown in FIG. 2 or 11, if it is assumed that the voltage applied to the strain gages Ra and Rb V≡Va(0)=Vb(0), when no pressure is applied (pressure p=0), the output is given by:

$$\Delta Vout = 2 \cdot (\Delta R/R) \cdot V \quad (9)$$

This shows that the sensitivity according to this embodiment is twice that of the prior art shown in FIG. 6. That is, if the sensitivity temperature compensation in the piezoresistance effect is carried out by the constant current driving, the present invention provides an advantageous effect.

Figure 3:
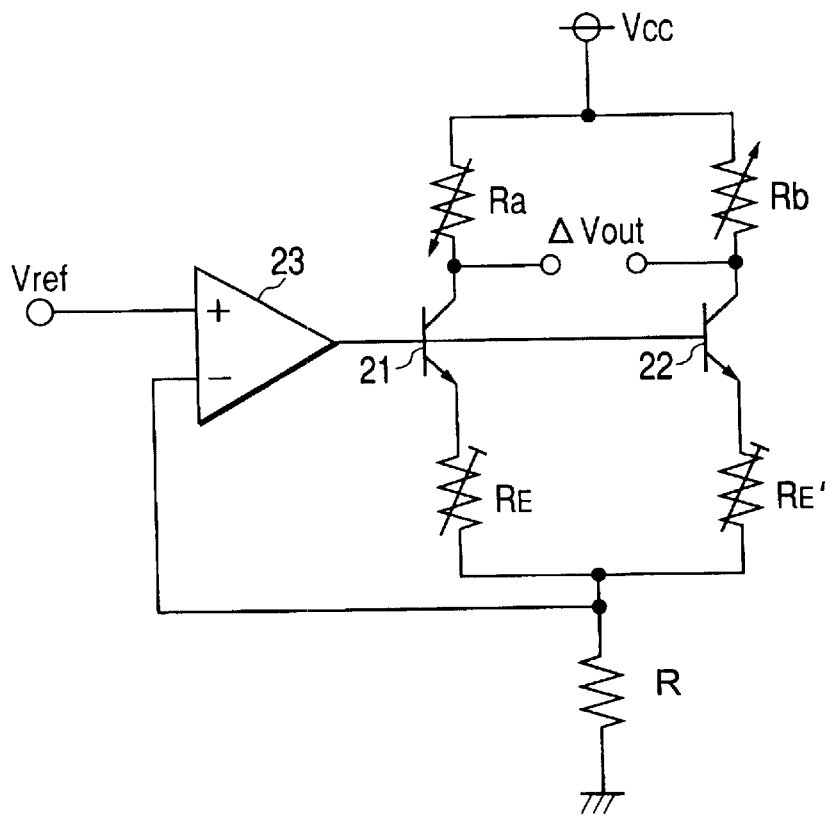
FIG. 3 is a schematic circuit diagram of a physical quantity detection circuit according to a first embodiment.

FIG. 3 shows an actual circuit for the circuit structure represented by the equivalent circuit shown in FIG. 2. In this circuit, two transistors (first and second transistors) 21 and 22 having equivalent characteristics (having a good pairing characteristic) are provided as control elements between the strain gage Ra and a trimming resistor (first control resistor) RE and between the strain gage Rb and the trimming resistor (second control resistor) RE'. Moreover, an operational amplifier 23 is provided to adjust base currents of the transistors 21 and 22 in accordance with the reference voltage Vref. The trimming resistors RE and RE' are grounded through a common resistor R. The junction point among the trimming resistors RE and RE' and the common resistor R is connected to an inverting input of the operational amplifier 23. That is, the operational amplifier 23 and two transistors 21 and 22 having favorable pairing characteristic, and resistors RE and RE' provide the constant current sources 11 and 12, wherein the operation amplifier 23 is shared by the constant current sources 11 and 12. These circuit elements may be formed also on the silicon substrate 1 or formed on another substrate. If the reference voltage Vref does not vary with temperature, the constant currents can be obtained if the temperature varies by using resistor elements having resistance temperature coefficients of almost zero (for example, thin film resistor made of CrSi) as the resistors R, RE, and RE'.

Two transistors having equivalent characteristics, i.e., a favorable pairing characteristic, means that their saturation currents Is are substantially equivalent to each other, and their collector resistances and emitter resistances are substantially equivalent to each other, respectively. Such transistors can be manufactured by forming these transistors near each other within one chip, more favorably, forming them neighboring to each other. Moreover, it is more favorable that the same patterns of the transistor are arranged on a substrate in the same direction.

In this circuit structure, trimming the resistor $R_E$ or $R_E'$ by laser adjusts the constant current Ia corresponding to the collector current of the transistor 21 or the constant current Ib corresponding to the collector current of the transistor 22. Moreover, at least, making the temperature characteristics of resistors R, $R_E$, and $R_E'$ equal to each other provides equivalent temperature coefficients to the constant currents Ia and Ib.

As mentioned above, the circuit structure shown in FIG. 3 can adjust the offset voltage. This provides the offset temperature characteristic compensation explained with reference to FIG. 2.

Moreover, the circuit structure shown in FIG. 3 uses the common resistor R, so that the trimming resistors RE or RE' can be used as fine trimming resistors. This makes it easy to compensate the offset temperature characteristic.

Here, in this embodiment, respective constant currents I≈Vref/(2R).

As mentioned above, this embodiment provides, the offset temperature characteristic compensation mainly caused by dispersion in the strain gages. However, because the offset temperature characteristic in the whole of the sensor may be developed by various causes, it is necessary to effect another offset temperature characteristic compensation toward these causes.

For example, the offset voltage and the offset temperature characteristic are dependent on thermal stress distribution on the diaphragm 1a where the strain gages Ra and Rb are formed, wherein the thermal stress is depended on the linear expansion coefficient of the base, the shape of the diaphragm 1a, and passivation. In this situation, the condition that TCRs of ΔRa, ΔRb, and R are equivalent to each other is not established, so that an error may occur. Therefore, different compensation operations are required for these causes. For example, an octagonal diaphragm can be used to cancel the effect of the thermal stress distribution as disclosed in Japanese patent No. 2864700.

As mentioned above, according to the first embodiment, the first and second constant currents Ia and Ib are adjusted to reduce the offset voltage in the voltage difference signal when no strain, that is, no physical quantity, is measured. The first and second current sources 11 and 12 may have substantially the same temperature coefficients in said first and second constant currents, respectively.

In adjusting the offset voltage in the first embodiment, the offset voltage Voff at a temperature within a usable temperature range of the physical quantity detection device is measured, and the first and second constant currents are adjusted on the basis of the measured offset voltage Voff. For example, either of the first or second resistors RE, RE' is trimmed to adjust the offset voltage Voff.

[Second Embodiment]

Figure 4:
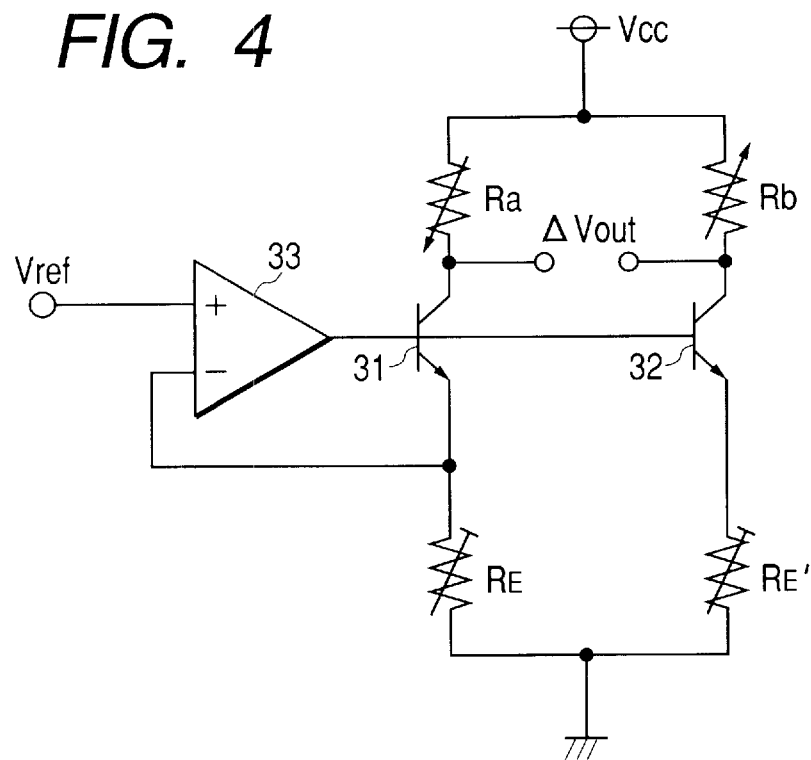
FIG. 4 is a schematic circuit diagram of a physical quantity detection circuit in a pressure sensor according to a second embodiment.

FIG. 4 is a schematic circuit diagram of a physical quantity detection circuit in a pressure sensor according to the second embodiment. The physical quantity detection circuit according to the second embodiment has substantially the same structure as that of the first embodiment. The difference is that the resistor R is omitted, and the inverting input of the operational amplifier 33 is supplied with a voltage at a junction point between a transistor 31 and the resistor $R_E$.

In this circuit structure, the transistors 31 and 32 have a favorable uniformity in their characteristics also. The operational amplifier 33 is shared by the constant current sources 11 and 12.

This circuit structure also makes it possible to adjust the constant current Ia corresponding to the collector current of the transistor 31 of the constant current Ib corresponding to the collector current of the transistor 32 by trimming the resistor $R_E$ or $R_E'$ by laser. Accordingly, with this circuit structure, the second embodiment also provides a favorable operation which is similar to the first embodiment.

On the other hand, because this circuit structure does not use the common resistor R (in FIG. 3), resistances of the resistors $R_E$ and $R_E'$ become larger values than those of the first embodiment. Accordingly, the resistors $R_E$ and $R_E'$ of the second embodiment may have larger dispersions. That is, in the second embodiment, respective constant currents I are represented by $I \approx Vref/R_E \approx Vref/R_E'$. Therefore, dispersions in constant currents are caused by the whole of (100% of) dispersions in resistance of resistors $R_E$ and $R_E'$. This ratio is larger than that in constant currents according to the first embodiment because these ratios in the first embodiment are reduced by the presence of the common resistor R.

In this respect, the circuit structure according to the first embodiment provides a favorable structure in fine trimming. On the other hand, the circuit structure according to the second embodiment uses the fewer parts than the first embodiment.

Here, the operation of the resistors $R_E$ and $R_E'$ which is common between the first and second embodiment will be described.

In the circuit structure shown in FIG. 4, the resistor $R_E$ acts as a current monitor for converting the current flowing through the transistor 31. Moreover, the resistors $R_E$ and $R_E'$ serve to reduce the dispersions in the currents flowing through respective transistors.

That is, transistors having uniformity in characteristics are used, and their bases are supplied with a common potential, and their emitters are connected to resistors having low dispersions. The other ends of the resistors are connected to another common potential.

In this circuit structure, it is known that this structure provides the following operation as described in Gray, Meyer, Analysis and Design of Analog Integrated Circuits, translated and published by Baifukan Co., Ltd, at the first volume, pages 254–257 (A4.1).

If (voltage drop across a resistor)$>>kT/q \approx 25.8$ mV, the dispersion in the current flowing through the transistor substantially depends on dispersions in the resistor and in a α of the transistor.

On the other hand, if (voltage drop across the resistor) $<<kT/q \approx 25.8$ mV, the dispersion in the current flowing through the transistor substantially depends on dispersions in Is of the transistor, wherein this condition also includes the case that there is no resistor in the circuit. Though dispersions vary with sizes of elements, examples in the general integrated circuits show that the dispersion in α is ±0.1% for npn transistors and ±1% for pnp transistors. The dispersion in the resistor is ±0.1~±2%, and the dispersion in Is is ±1~10%.

Accordingly, to suppress the dispersion, using a rather large size of npn transistors and a resistor suppresses the dispersion in the current which is equal to or smaller than ±0.2%. On the other hand, in the case of no resistor, it is difficult to obtain the dispersion which is equal to or smaller than ±1%.

In the above-mentioned description, k represents Boltzman's constant, T represents an absolute temperature (300 K≈27° C.), q represents an elementary electric charge, α represents a characteristic value of the transistor (collector current value/emitter current value), and Is represents a saturation current.

Accordingly, the first and second embodiments provide favorable circuit structures for obtaining uniform temperature coefficients of two constant currents.

In adjusting the offset voltage in the second embodiment, the offset voltage at a temperature within a usable temperature range of the physical quantity detection device is measured. The first and second constant currents are adjusted on the basis the measured offset voltage. For example, the offset voltage is adjusted by trimming the resistors $R_E$ or $R_E'$ on the basis of the measurement.

[Third Embodiment]

In the above-mentioned embodiments, trimming provides the constant currents Ia and Ib. On the other hand, the third embodiment provides the constant current Ia and Ib in a different method from the above-mentioned embodiments.

Figure 5:
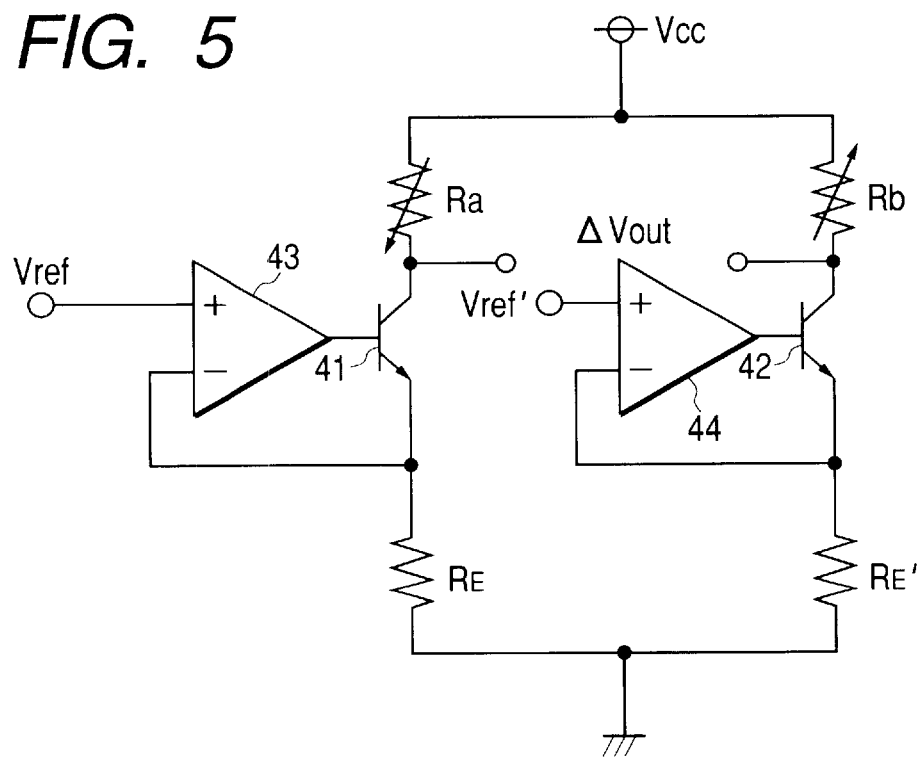
FIG. 5 is a schematic circuit structure of a physical quantity detection circuit for a pressure sensor according to a third embodiment.

FIG. 5 shows a schematic circuit structure of a physical quantity detection circuit for a pressure sensor according to the third embodiment. This circuit includes two operational amplifiers 43 and 44 for supplying control voltages to two transistors (first and second transistors) 41 and 42 provided between the strain gage Ra and the resistor (first resistor) $R_E$ and between the strain gage Rb and the resistor (second resistor) $R_E'$. Here, these transistors 41 and 42 may have non-uniform characteristics. On the other hand, the resistors $R_E$ and $R_E'$ should have uniform (equivalent) temperature characteristics.

The operational amplifier (first operational amplifier) 43 adjusts the base current of the transistor 41 on the basis of a reference voltage (first reference voltage) Vref, and the operational amplifier (second operational amplifier) 44 adjusts the base current of the transistor 42 on the basis of a reference voltage (second reference voltage) Vref'.

In operation, adjusting respective reference voltages Vref and Vref' for two operational amplifiers 43 and 44 provides adjustment in the offset voltage Voff. This can adjust the offset temperature characteristic. For example, d/a converters (not shown) generate the reference voltages Vref and Vref', so that they can digitally adjust the offset temperature characteristic. This provides the same operation as the structure according to the first embodiment without the laser trimming.

In this circuit structure, because difference in the offset voltage and accompanying offset temperature characteristic between the operational amplifiers 43 and 44 appear at the differential output, the operational amplifiers having sufficiently low offset voltage difference therebetween should be used as the operational amplifiers 43 and 44.

In adjusting the offset voltage in the third embodiment, the offset voltage at a temperature within a usable temperature range of the physical quantity detection device is measured, and the first and second constant currents are adjusted on the basis the measured offset voltage. For example, the first and second reference voltages are controlled to adjust the difference voltage on the basis of the measurement to adjust the offset voltage.

[Modifications]

Figure 8:
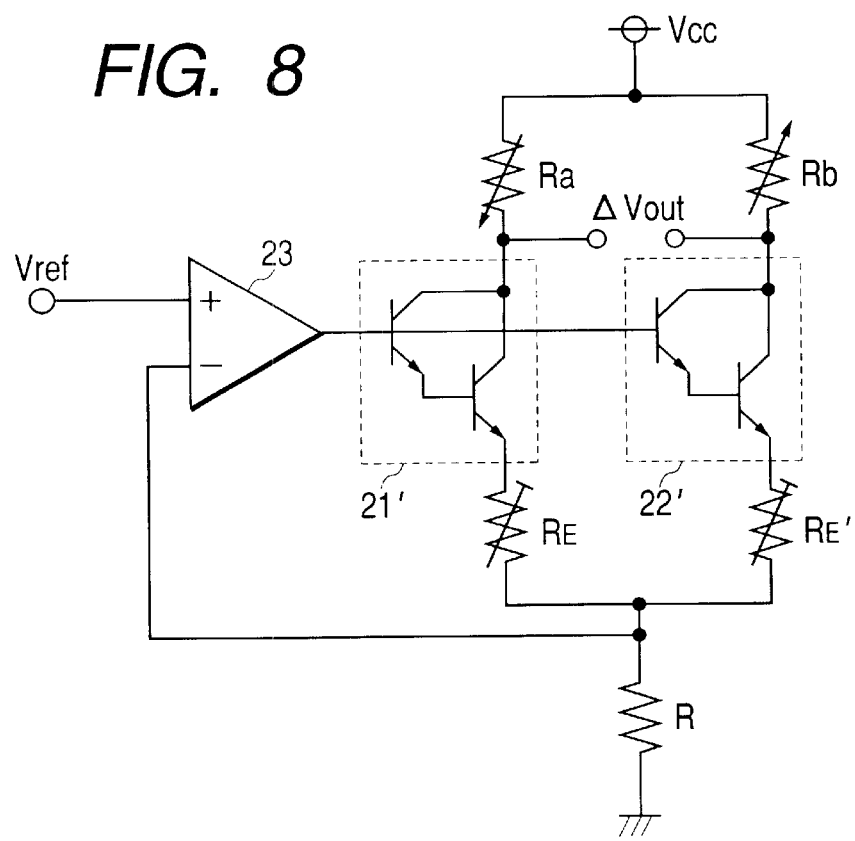
FIG. 8 is a schematic circuit diagram of a modification physical quantity detection circuit according to the first embodiment.
Figure 9:
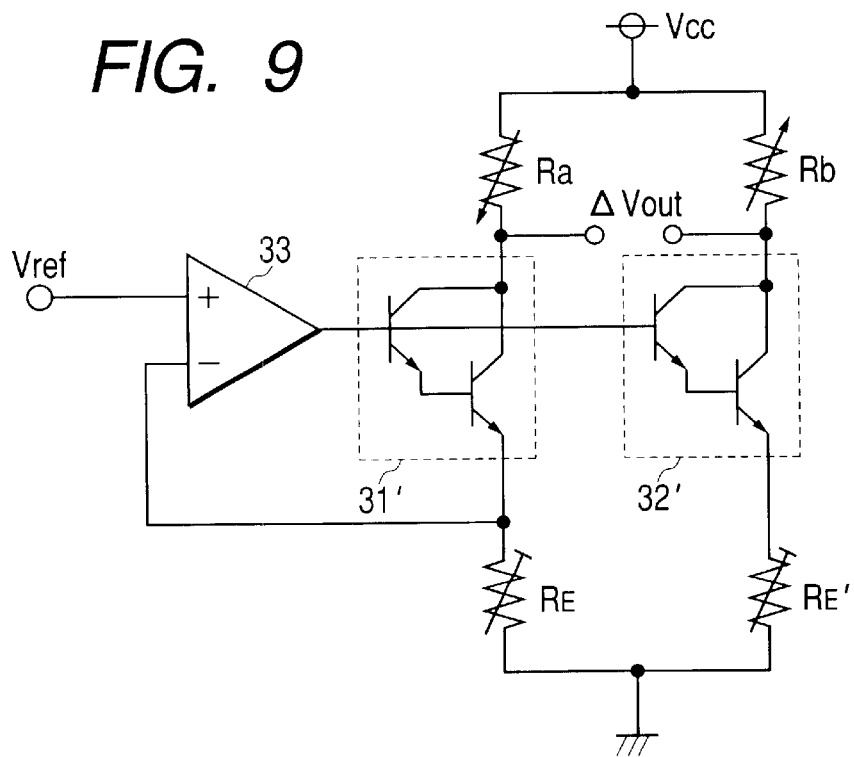
FIG. 9 is a schematic circuit diagram of a modification physical quantity detection circuit according to the second embodiment.
Figure 10:
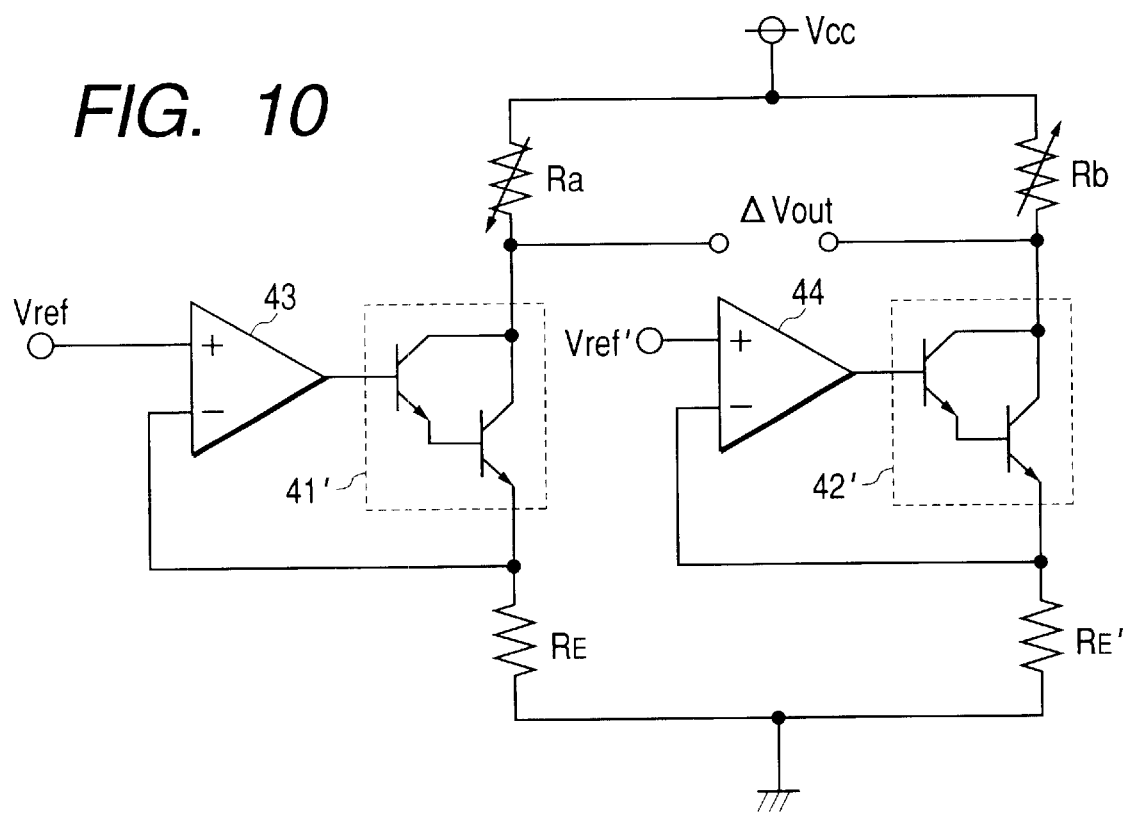
FIG. 10 is a schematic circuit diagram of a modification physical quantity detection circuit according to the third embodiment.

FIGS. 8 to 10 show modifications of first to third embodiments. In the first to third embodiments (FIGS. 3 to 5), transistors are independently used as control elements. On the other hand, the modified circuit structures according to the first to third embodiments use transistors 21', 22', 31', 32', 41' and 42' having the Darlington connection. This circuit structure reduces the error due to the base currents of transistors.

Moreover, the equivalent circuit shown in FIG. 11 provides the same operation as that shown in FIG. 2. The actual circuit structures corresponding to the equivalent circuit shown in FIG. 11 are shown in FIGS. 12 to 17. In these drawings, the same elements are designated with the same references.

Figure 15:
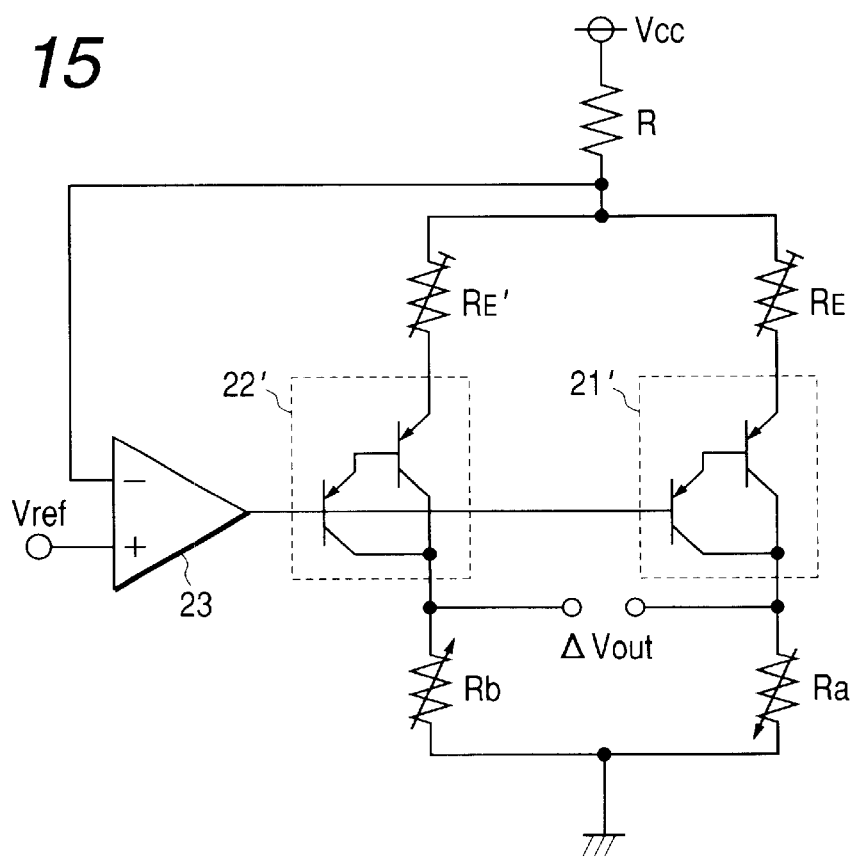
Figure 16:
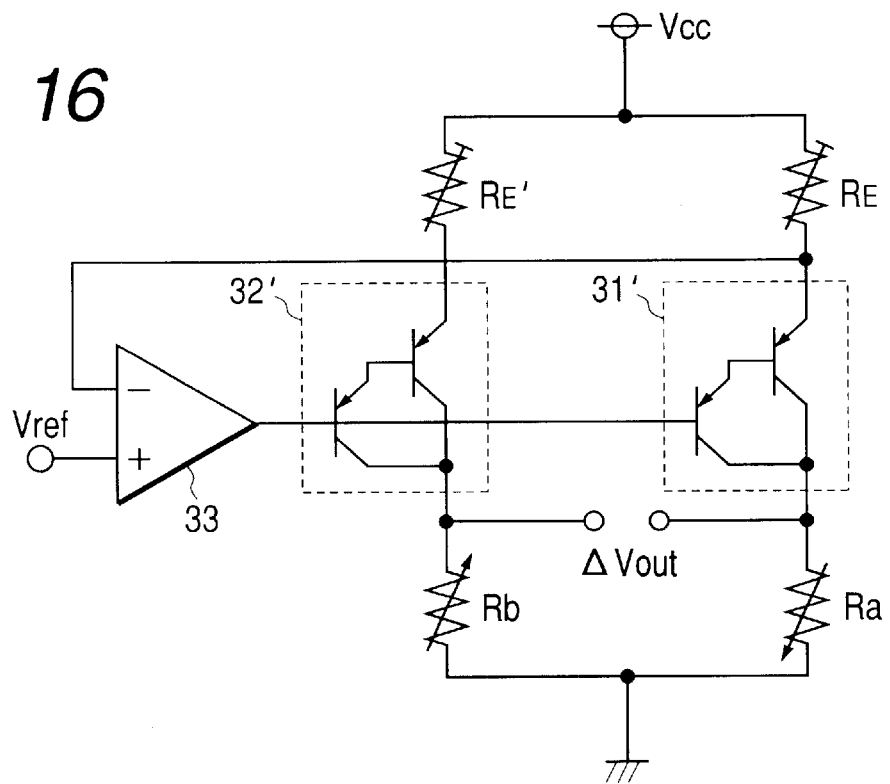
Figure 17:
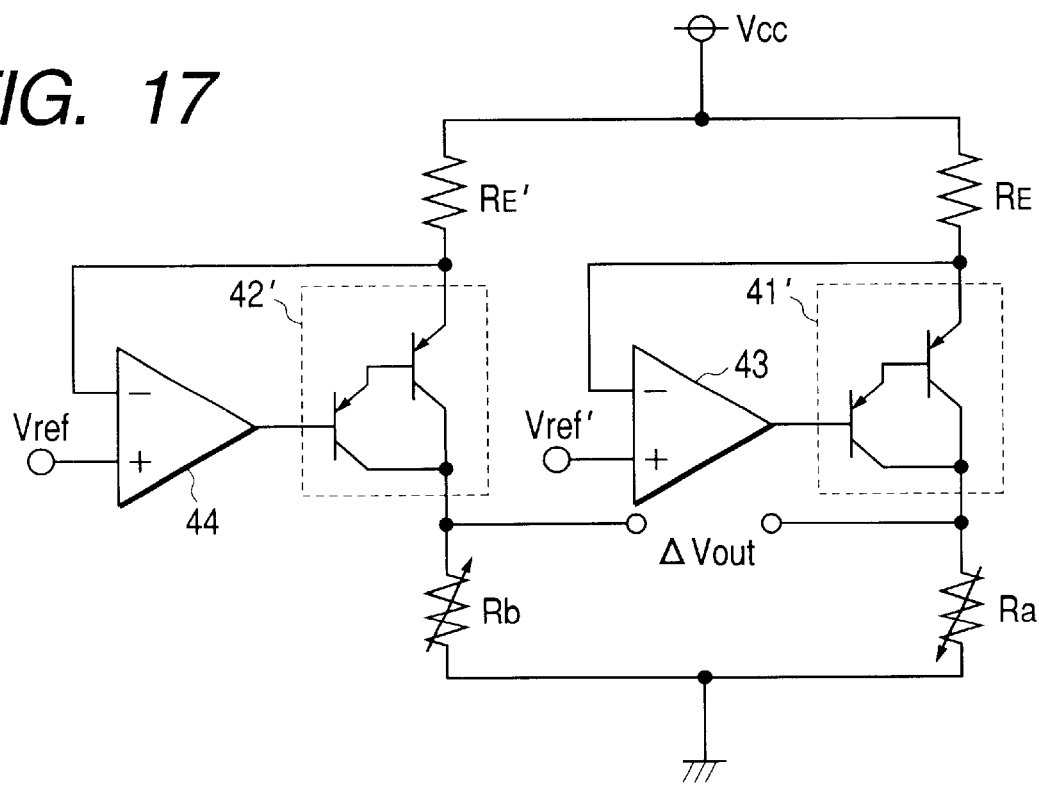

These modification circuit structures use pnp transistors. Since there is a tendency that the pnp transistor has a lower common-emitter static forward current transfer ratio hFE than that of the npn transistor, it is favorable that the circuit structure with pnp transistors adopts transistors 21', 21', 31', 32', 41', and 42' having the Darlington connection as shown in FIGS. 15 to 17.

Figure 18:
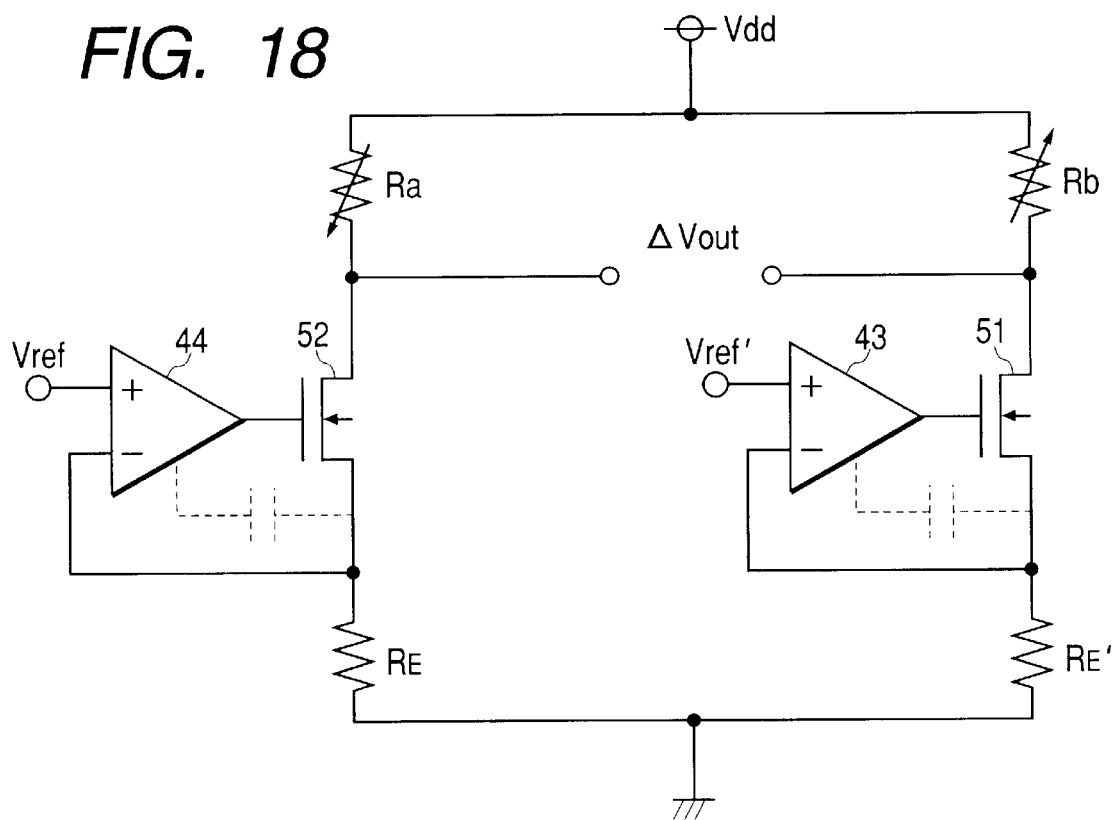
FIGS. 18 and 19 are schematic circuit diagrams of modification physical quantity detection circuits according to the third embodiment.
Figure 19:
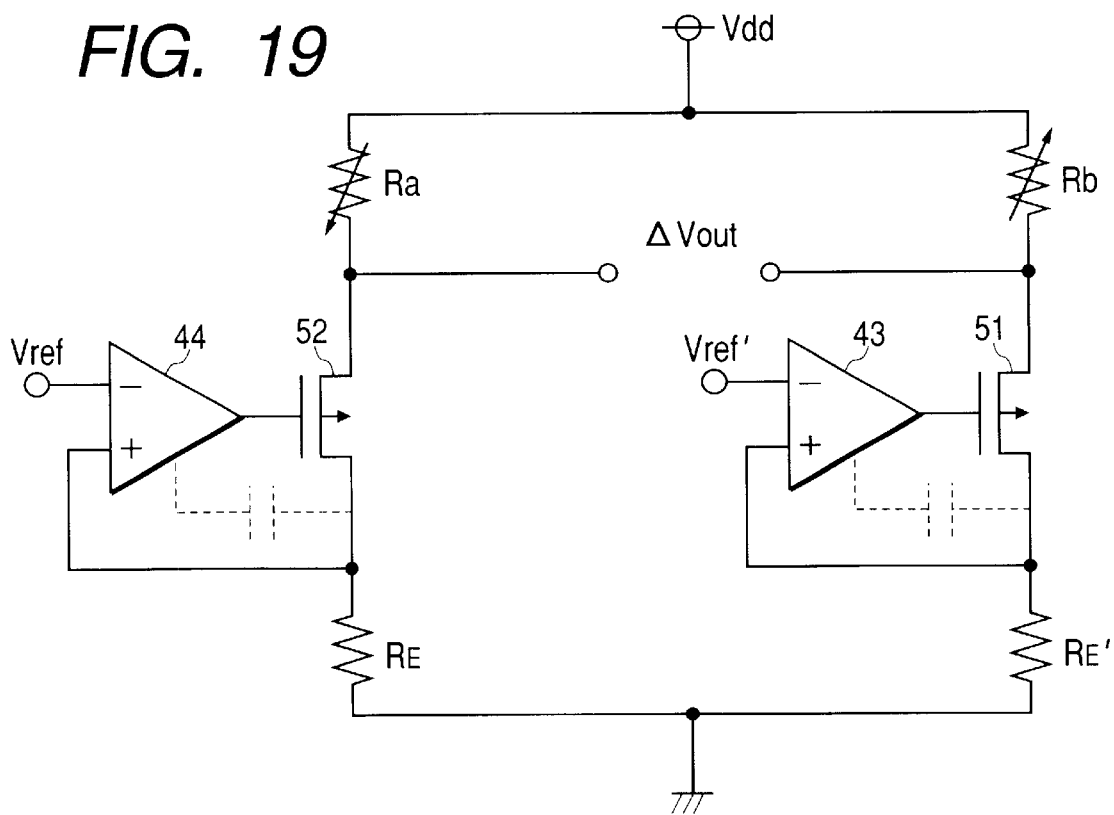
Figure 20:
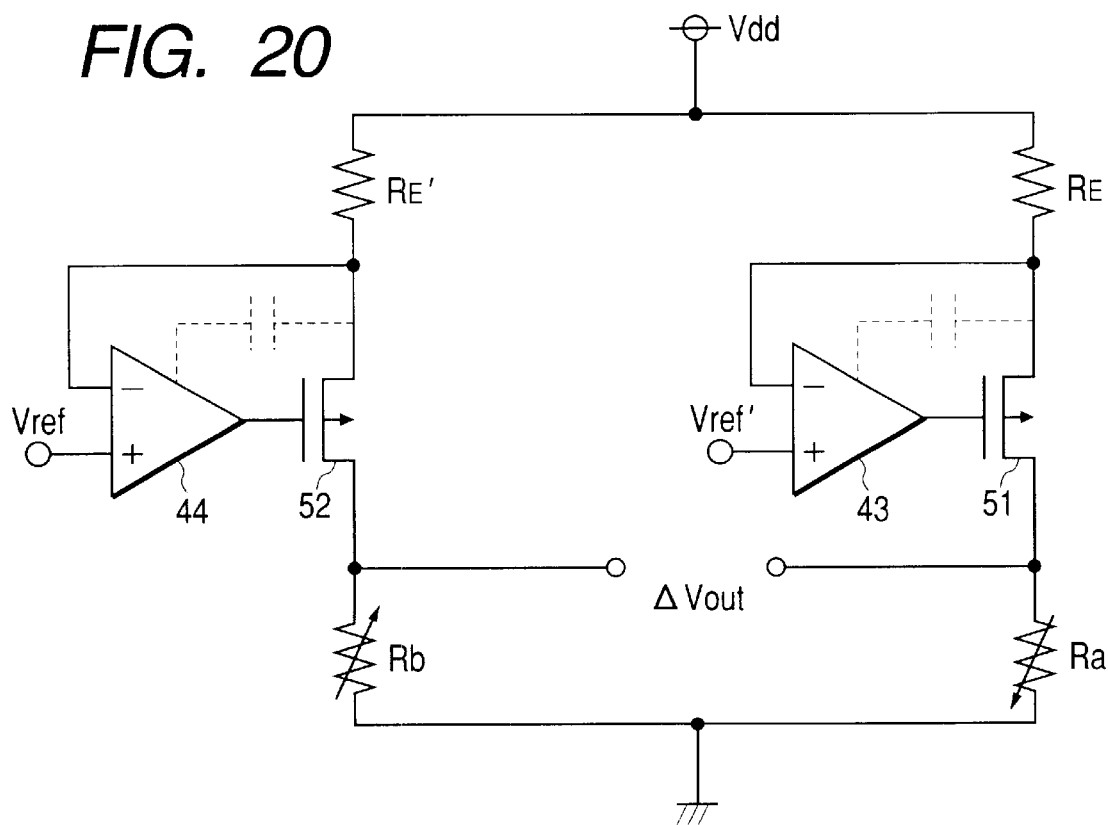
FIGS. 20 and 21 are schematic circuit diagrams of modifications of the physical quantity detection circuit shown in FIG. 17, wherein transistors are replaced with MOS FETs.
Figure 21:
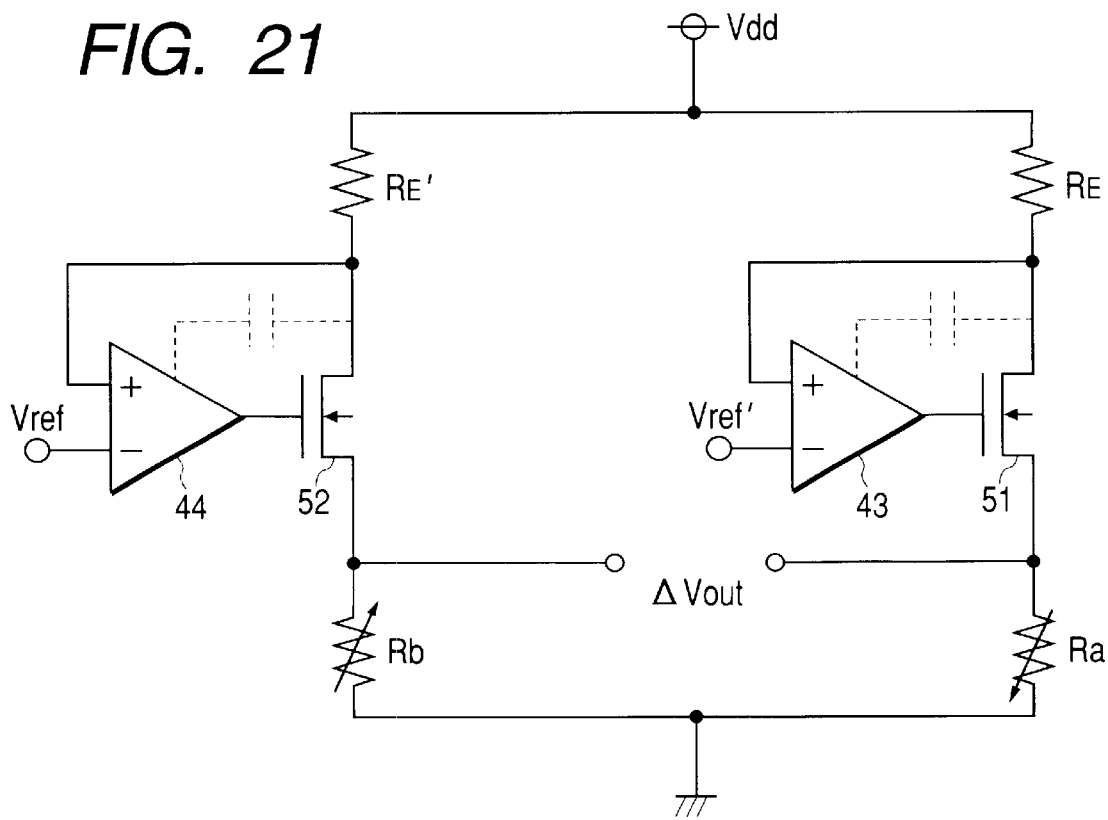

Moreover, a further modification regarding the third embodiment may be provided. That is, the control element is replaced with a MOS transistor. FIGS. 18 and 19 show this case. Further, the control element shown in FIG. 17 can be replaced with a MOS transistor. FIGS. 20 and 21 show this case. As shown in FIGS. 18 to 21, MOS transistors 51 and 52 can be used as the control elements. In these structures, chain lines represent phase compensation capacitors which may be connected as occasion demands. Further, in the structures in FIGS. 19 and 20, the reference voltage Vref is supplied to non-inverting inputs of the operational amplifiers 43 and 44 contrary to the other circuit structures.

This invention has been described with embodiments mentioned above. However, this invention should not be limited to the actual structures shown in FIGS. 2 and 11.

Moreover, in the circuit structures mentioned above, the connection point between two strain gages is connected to the supply voltage Vcc or the ground GND. However, it is also possible to connect it to a potential varying in accordance with the temperature. This is because the difference voltage between two output terminals provides the output of the physical quantity detection circuit, and thus, variation does not affect to the detection signal.

Moreover, the circuit structures have been described with the example of the pressure sensor. However, this invention can be applied to an acceleration sensor using variation in resistance as a physical quantity sensor for example.

Figure 22:
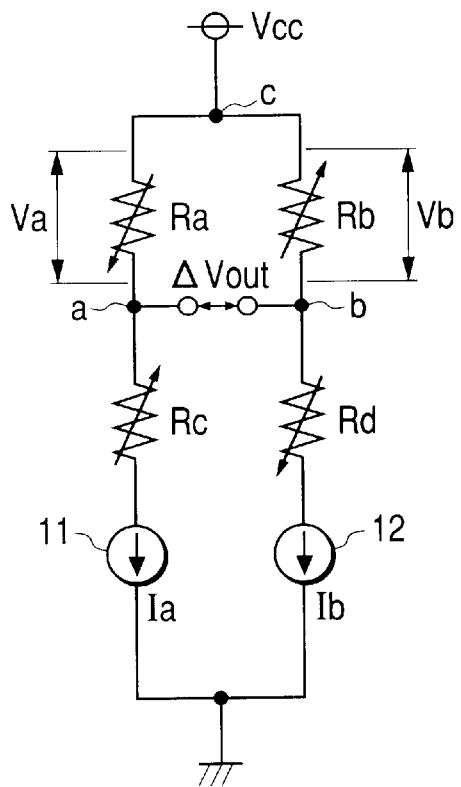
FIGS. 22 and 23 are modifications of physical quantity detection circuits of the present invention with a bridge structure.
Figure 23:
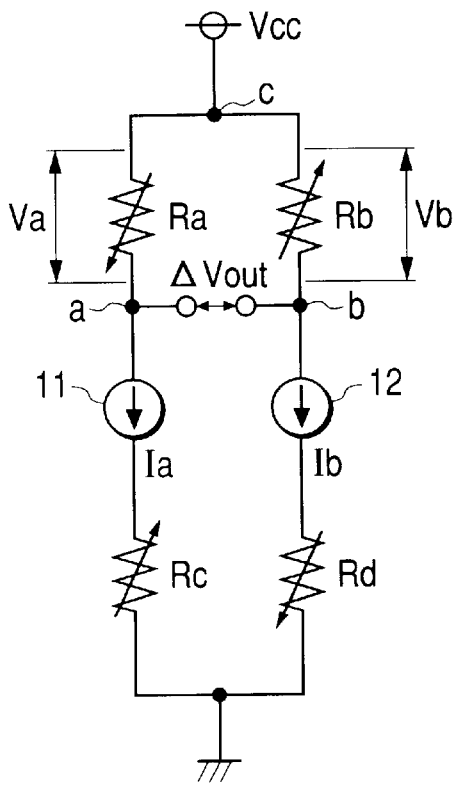

FIGS. 22 and 23 are equivalent circuit diagrams of further modifications.

The physical quantity detection circuit shown in FIG. 22 has a sensing resistor Rc between the junction point "a" and the constant current source 11 and a sensing resistor Rd between the junction point "b" and the constant current source 12 in addition to the circuit structure shown in FIG. 2 to provide a full-bridge structure. This circuit structure provides offset temperature characteristic compensation similarly to the first embodiment also. In this case, the sensing resistors Rc and Rd are arranged on the top surface of the substrate 1 also. The locations of the sensing resistors Rc and Rd are provided to have the bridge structure. FIG. 23 shows the full bridge structure too. This circuit structure provides offset temperature characteristic compensation similarly to the first embodiment also.

What is claimed is:

1. A physical quantity detection device comprising:
   a first sensing resistor having a first resistance varying in accordance with a first physical quantity relating to a detection physical quantity;
   a second sensing resistor having a second resistance varying in accordance with a second physical quantity relating to said detection physical quantity, respective first ends of said first and second sensing resistors being connected to a first voltage potential;
   a first current source for flowing a first constant current through said first sensing resistor, a first end of said first current source being connected to a second end of said first sensing resistor;
   a second current source for flowing a second constant current through said second sensing resistor, a first end of said second current source being connected to a second end of said second sensing resistor, second ends of said first and second current sources being connected to a second potential which is different from said first voltage potential; and
   outputting means for outputting a voltage difference signal indicative of said detection physical quantity between the second ends of said first and second sensing resistors.

2. A physical quantity detection device as claimed in claim 1, wherein said first and second current sources have substantially the same temperature coefficients in said first and second constant currents, respectively.

3. A physical quantity detection device as claimed in claim 1, further comprising an operational amplifier for generating a control voltage on the basis of a reference voltage, said operational amplifier being shared by said first and second current sources, wherein said first current source further includes a first control element and a first control resistor for flowing said first constant current on the basis of said control voltage, and said second current source further includes a second control element and a second control resistor for flowing said second constant current on the basis of said control voltage.

4. A physical quantity detection device as claimed in claim 3, wherein second ends of said first and second control resistors are connected to each other at a junction point, said physical quantity detection device further comprising a common resistor connected to said junction point, wherein said first and second control resistors are connected to said second potential through said common resistor, and a voltage potential of said junction point is supplied to an input of said operational amplifier.

5. A physical quantity detection device as claimed in claim 3, wherein second ends of said first and second control resistors are connected to each other at a junction point, and a voltage potential of said junction point is supplied to an input of said operational amplifier.

6. A physical quantity detection device as claimed in claim 3, wherein either of said first or second control resistors comprises a trimming resistor.

7. A physical quantity detection device as claimed in claim 1, wherein said first current source includes a first control element connected to said first sensing resistor in series, and a first control resistor connected to said first control element in series, and a first amplifier for generating a first control voltage supplied to said first control element on the basis of a first reference voltage, and said second current source includes a second control element connected to said second sensing resistor in series, a second control resistor connected to said second control element in series, and a second amplifier for generating a second control voltage supplied to said second control element on the basis of a second reference voltage.

8. A physical quantity detection device as claimed in claim 7, wherein a voltage potential at a first junction point between said first control element and said first control resistor is supplied to an input of said first operational amplifier and a voltage potential at a second junction point between said second control element and said second control resistor is supplied to an input of said second operational amplifier.

9. A physical quantity detection device comprising:
   a first circuit including a first sensing resistor and a first constant current source connected to said first sensing resistor in series through a first junction point, said first sensing resistor having a first resistance varying in accordance with a first physical quantity relating to a detection physical quantity, said first constant current source flowing a first constant current through said first sensing resistor;
   a second circuit including a second sensing resistor and a second constant current source connected to said second sensing resistor in series through a second junction point, said second sensing resistor having a second resistance varying in accordance with a second physical quantity relating to said detection physical quantity, said second constant current source flowing a second constant current through said second sensing resistor, respective first ends of said first and second circuits being connected to a first potential, respective second ends of said first and second circuits being connected to a second potential which is different from said first potential; and outputting means for outputting a voltage difference signal indicative of said detection physical quantity between said first and second junction points.

10. A physical quantity detection device as claimed in claim 9, wherein said first and second current sources have substantially the same temperature coefficients in said first and second constant currents, respectively.

11. A physical quantity detection device as claimed in claim 9, further comprising an operational amplifier for generating a control voltage on the basis of a reference voltage, said operational amplifier being shared by said first and second current sources, wherein said first current source further includes a first control element and a first control resistor for flowing said first constant current on the basis of said control voltage, and said second current source further includes a second control element and a second control resistor for flowing said second constant current on the basis of said control voltage.

12. A physical quantity detection device as claimed in claim 11, wherein second ends of said first and second control resistors are connected to each other at a junction point, said physical quantity detection device further comprising a common resistor connected to said junction point, wherein said first and second control resistors are connected to said second potential through said common resistor, and a voltage potential of said junction is supplied to an input of said operational amplifier.

13. A physical quantity detection device as claimed in claim 11, wherein second ends of said first and second control resistors are connected to each other at a junction point, and a voltage potential of said junction point is supplied to an input of said operational amplifier.

14. A physical quantity detection device as claimed in claim 3, wherein either of said first or second control resistors comprises a trimming resistor.

15. A physical quantity detection device as claimed in claim 9, wherein said first current source includes a first control element connected to said first sensing resistor in series, and a first control resistor connected to said first control element in series, and a first amplifier for generating a first control voltage supplied to said first control element on the basis of a first reference voltage, and said second current source includes a second control element connected to said second sensing resistor in series, a second control resistor connected to said second control element in series, and a second amplifier for generating a second control voltage supplied to said second control element on the basis of a second reference voltage.

16. A physical quantity detection device as claimed in claim 15, wherein a voltage potential at a first junction point between said first control element and said first control resistor is supplied to an input of said first operational amplifier and a voltage potential at a second junction point between said second control element and said second control resistor is supplied to an input of said second operational amplifier.

17. A method of adjusting an offset voltage in a physical quantity detection device comprising:

a first sensing resistor having a first resistance varying in accordance with a first physical quantity relating to a detection physical quantity;

a second sensing resistor having a second resistance varying in accordance with a second physical quantity relating to said detection physical quantity, respective first ends of said first and second sensing resistors being connected to a first voltage potential;

a first current source for flowing a first constant current through said first sensing resistor, a first end of said first current source being connected to a second end of said first sensing resistor;

a second current source for flowing a second constant current through said second sensing resistor, a first end of said second current source being connected to a second end of said second sensing resistor, second ends of said first and second current sources being connected to a second potential which is different from said first voltage potential; and outputting means for outputting a voltage difference signal indicative of said detection physical quantity between the second ends of said first and second sensing resistors with said offset voltage, said method comprising the steps of:

measuring said offset voltage at a temperature within a usable temperature range of said physical quantity detection device; and adjusting said first and second constant currents on the basis said measured offset voltage.

18. A method of adjusting an offset voltage in a physical quantity detection device comprising:

a first sensing resistor having a first resistance varying in accordance with a first physical quantity relating to a detection physical quantity;

a second sensing resistor having a second resistance varying in accordance with a second physical quantity relating to said detection physical quantity, respective first ends of said first and second sensing resistors being connected to a first voltage potential;

a first current source for flowing a first constant current through said first sensing resistor, a first end of said first current source being connected to a second end of said first sensing resistor, said first current source includes a first control element and a first control resistor for flowing said first constant current on the basis of a control voltage;

a second current source for flowing a second constant current through said second sensing resistor, a first end of said second current source being connected to a second end of said second sensing resistor, said second current source includes a second control element and a second control resistor for flowing said second constant current on the basis of said control voltage;

an operational amplifier shared by said first and second constant current sources for generating said control voltage on the basis of a reference voltage, wherein a difference voltage between a first junction point between said first sensing resistor and said first current source and a second junction point between said second sensing resistor and said second current source includes an offset voltage, which is equal to said difference voltage when said detection physical quantity is not detected by said physical quantity detection device, said method comprising the steps of:

measuring said offset voltage; and trimming either of said first or second control resistors to adjust said offset voltage.

19. A method of adjusting an offset voltage in a physical quantity detection device comprising:
- a first sensing resistor having a first resistance varying in accordance with a first physical quantity relating to a detection physical quantity;
- a second sensing resistor having a second resistance varying in accordance with a second physical quantity relating to said detection physical quantity, respective first ends of said first and second sensing resistors being connected to a first voltage potential;
- a first current source for flowing a first constant current through said first sensing resistor, a first end of said first current source being connected to a second end of said first sensing resistor, said first current source including a first control element and a first control resistor for flowing said first constant current on the basis of a first control voltage, and a first operational amplifier for generating said first control voltage on the basis of a first reference voltage;
- a second current source for flowing a second constant current through said second sensing resistor, a first end of said second current source being connected to a second end of said second sensing resistor, said second current source including a second control element and a second control resistor for flowing said second constant current on the basis of a second control voltage, and a second operational amplifier for generating said second control voltage on the basis of a second reference voltage, wherein a difference voltage between a first junction point between said first sensing resistor and said first current source and a second junction point between said second sensing resistor and said second current source indicates said detection physical quantity, wherein said difference voltage includes an offset voltage, and said difference voltage is equal to the offset voltage when said detection physical quantity is not detected by said physical quantity device, said method comprising the steps of:
- measuring said offset voltage; and
- controlling said first and second reference voltages to adjust said offset voltage on the basis of the result of the measuring.

\* \* \* \* \*